(12) United States Patent
Arai

(10) Patent No.: US 7,813,179 B2
(45) Date of Patent: Oct. 12, 2010

(54) SEMICONDUCTOR MEMORY DEVICE HAVING PLURAL WORD LINES ARRANGED AT NARROW PITCH AND MANUFACTURING METHOD THEREOF

(75) Inventor: Norihisa Arai, Saitama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 147 days.

(21) Appl. No.: 12/178,089

(22) Filed: Jul. 23, 2008

(65) Prior Publication Data

US 2009/0027964 A1 Jan. 29, 2009

(30) Foreign Application Priority Data

Jul. 24, 2007 (JP) ............... 2007-192278

(51) Int. Cl.
G11C 16/04 (2006.01)

(52) U.S. Cl. ................... 365/185.17; 365/63

(58) Field of Classification Search ............ 365/185.17, 365/63; 257/E29.133, E27.091; 438/257
See application file for complete search history.

(56) References Cited

U.S. PATENT DOCUMENTS 7,244,984 B2    7/2007  Kamigaichi et al.
7,263,000 B2    8/2007  Hazama et al.
7,687,346 B2*   3/2010  Yaegashi et al. ............ 438/257
2006/0214211 A1  9/2006  Miyazaki et al.
2007/0210372 A1  9/2007  Park et al.

OTHER PUBLICATIONS

Jae-Duk Lee, et al., "A new Programming Disturbance Phenomenon in NAND Flash Memory by Source/Drain Hot-Electrons Generated by GIDL Current", IEEE NCSMW 2006, pp. 31 to 33.

* cited by examiner

Primary Examiner—Vu A Le
(74) Attorney, Agent, or Firm—Oblon, Spivak, McClelland, Maier & Neustadt, L.L.P.

(57) ABSTRACT

A semiconductor memory device includes a memory cell array which includes at least one memory unit having a preset number of memory cell transistors and a selection gate transistor on a source side, a preset number of word lines respectively connected to control gates of the preset number of memory cell transistors, and a selection gate line on a source side connected to a gate electrode of the selection gate transistor on the source side. In the semiconductor memory device, a distance C between the selection gate line at least on the source side and one of the word lines adjacent thereto is set to $n*A+(n-1)B$, where n is an integer greater than or equal to 2, A indicates the pitch between adjacent ones of the preset number of word lines, and B indicates the width of each of the preset number of word lines.

10 Claims, 12 Drawing Sheets

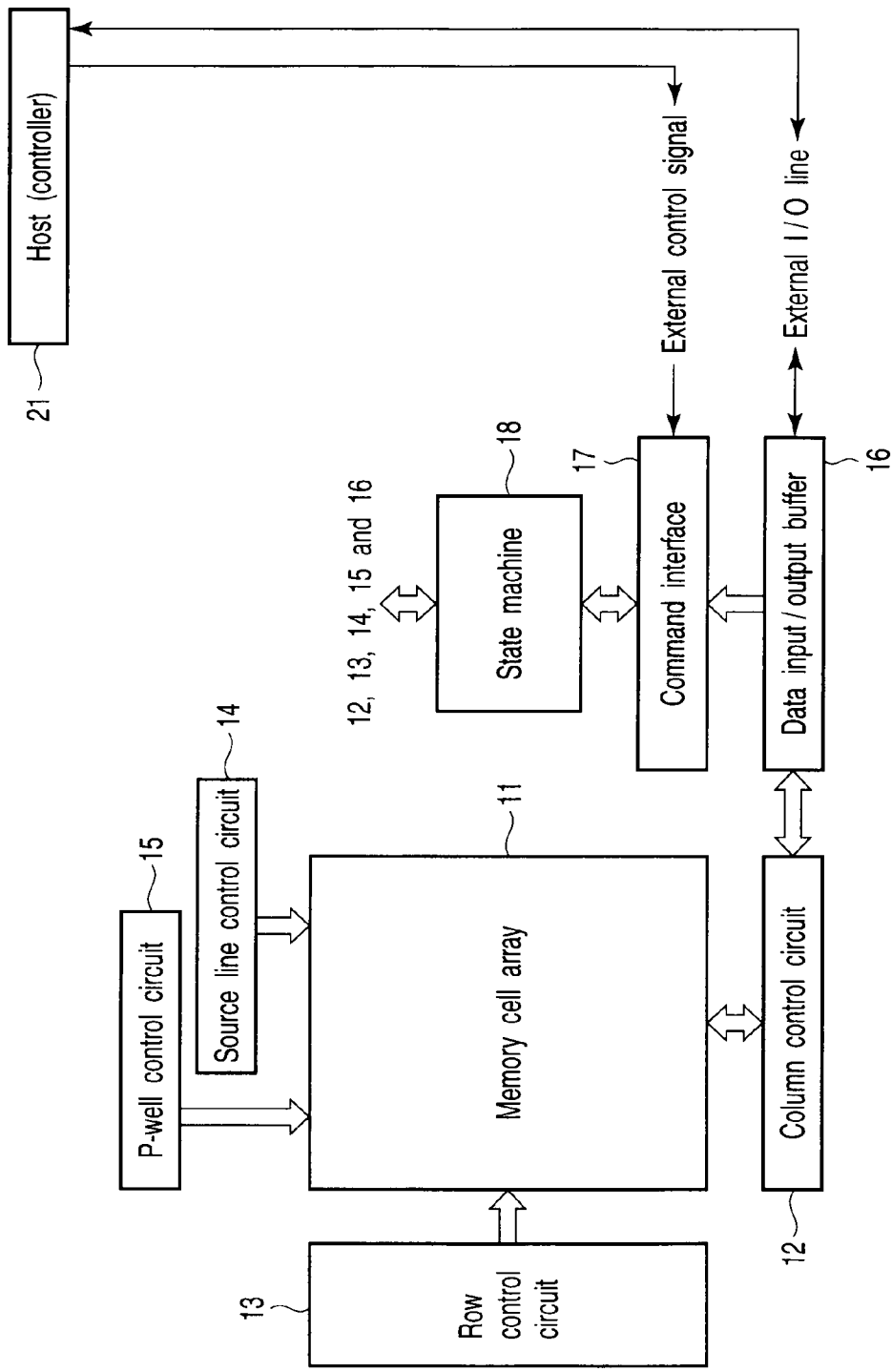
F I G. 1

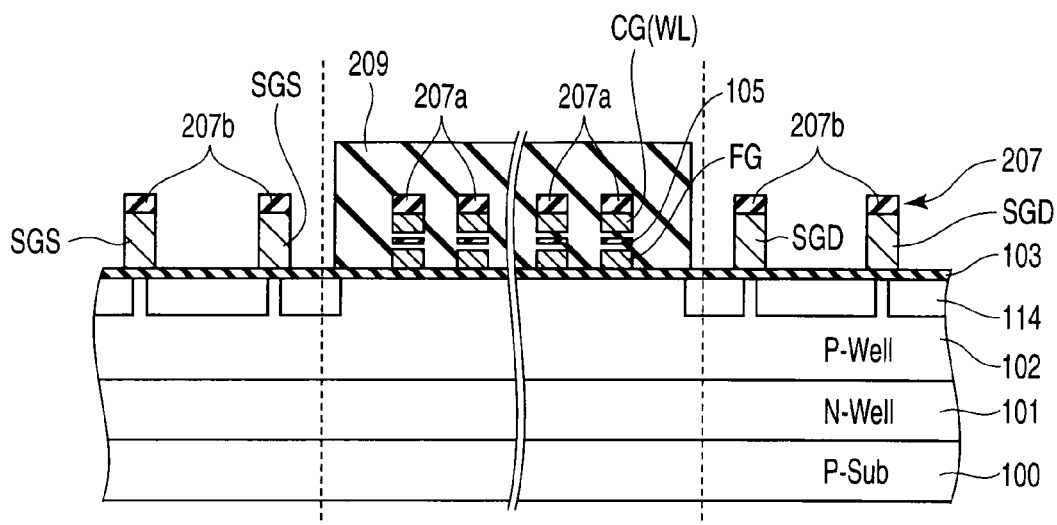
F I G. 12
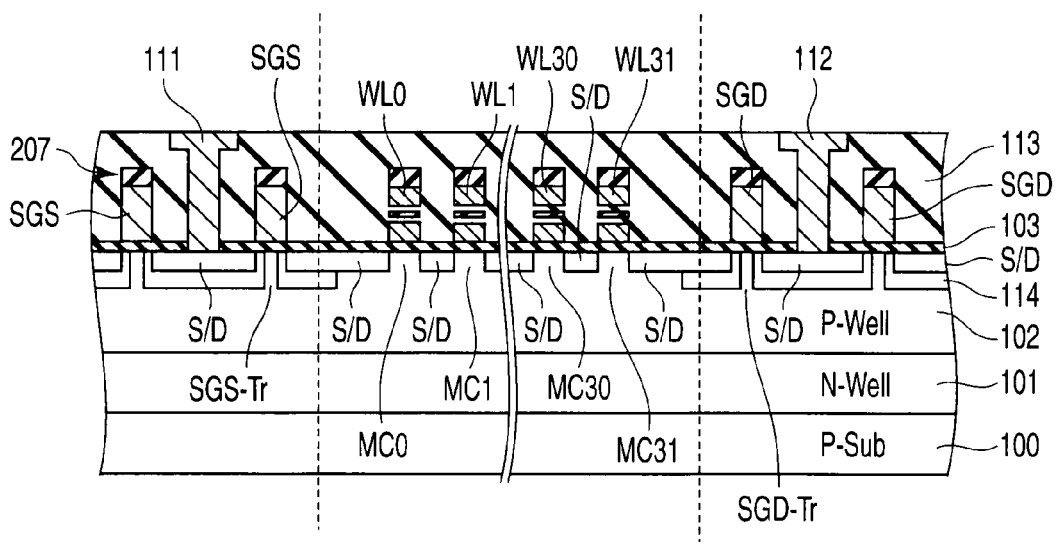
F I G. 13

SEMICONDUCTOR MEMORY DEVICE HAVING PLURAL WORD LINES ARRANGED AT NARROW PITCH AND MANUFACTURING METHOD THEREOF

CROSS-REFERENCE TO RELATED APPLICATIONS

This application is based upon and claims the benefit of priority from prior Japanese Patent Application No. 2007-192278, filed Jul. 24, 2007, the entire contents of which are incorporated herein by reference.

BACKGROUND OF THE INVENTION

1. Field of the Invention

This invention relates to a semiconductor memory device and a manufacturing method thereof and, more particularly, to a nonvolatile memory device having a plurality of cell word lines arranged at extremely narrow pitches as is represented by a NAND flash memory.

2. Description of the Related Art

For example, in the case of a NAND flash memory, a more inexpensive nonvolatile memory device is realized by setting the chip size to minimum. That is, a lowering in the cost of the NAND flash memory is realized by using a memory cell array form in which a plurality of NAND strings (NAND memory units) are arranged in an array form. In this case, each NAND string is configured by a preset number of flash memory cells (NAND cells) and two selection gate transistors arranged to sandwich the preset number of flash memory cells. Further, in the case of a memory cell array form, since contact holes are not arranged between cell word lines that are connected to control gate electrodes of the flash memory cells having the stacked gate structures, it is advantageous that the cell word lines can be arranged at extremely narrow pitches in minimizing the chip size.

NAND flash memories are accepted in the market and the market scale is significantly enlarged. Further, in order to meet the demand of the market, a nonvolatile memory device with higher density is realized by enhancing the performance of a processing exposure device and developing a memory cell array that is miniaturized to the limit of exposure of the exposure device.

For example, in the conventional NAND flash memory, the NAND strings are miniaturized to the limit of exposure of the exposure device used for resist-processing a line pattern of the cell word lines. That is, the distance A between the adjacent cell word lines, the width B of the cell word line and the distance C between the selection gate line and the cell word line that lies adjacent to the selection gate line are respectively miniaturized to the limit of exposure of the exposure device and are often set to the same value (A=B=C).

However, in miniaturizing the NAND strings and miniaturizing the memory cell array, an example that threatens the reliability of the cell is reported (for example, see Jae-Duk Lee, "A new programming disturbance phenomenon in NAND flash memory by source/drain hot-electrons generated by GIDL current" IEEE NVSMW 2006 pp. 31 to 33). According to the report, there is disclosed a problem that a defect occurs in which hot-electrons are injected into a floating gate electrode corresponding to a cell word line adjacent to the selection gate line on the source side by a gate-induced drain leakage (GIDL) current caused by potential transferred to the selection gate line arranged on the source side at the data write operation time and data is destroyed. In order to solve the problem, it is supposed that it is indispensable to enlarge the distance between the selection gate line on the source side configuring the NAND string and the cell word line adjacent thereto to approximately 110 nm. However, this condition (C>A=B, C≧110 nm) harms the relation (A=B=C) in the miniaturization process at the exposure limit.

Further, if the distance (C) between the selection gate line on the source side and the cell word line adjacent thereto is enlarged without limitation, it is known that an exposure focus margin for resist-processing is reduced by the limitation of the lithography technology. It is the known fact that light from the light source that passes through an opening portion of the mask has a constant wavelength (for example, 193 nm in the case of an ArF ray) and is applied to the mask with constant light intensity. In the case of a non-repetitive pattern, it becomes difficult to realize the stable resist-process due to disturbance of the light intensity. That is, if the selection gate line on the source side is arranged to harm the repetitiveness of the cell word line adjacent thereto (C>A=B), it becomes impossible to miniaturize a resist used to process the selection gate lines and cell word lines to the limit of exposure of the exposure device.

A lowering in the exposure focus margin makes formation of the cell word lines and selection gate lines unstable. Particularly, disturbance in the process of the cell word lines in the width direction causes the threshold value (Vth) distribution width to be enlarged after writing or erasing of the flash memory cell and thus the manufacturing yield and the reliability of the NAND flash memory may be reduced.

BRIEF SUMMARY OF THE INVENTION

According to a first aspect of the present invention, there is provided a semiconductor memory device comprising a memory cell array including at least one memory unit having a preset number of memory cell transistors and a selection gate transistor on a source side; a plurality of word lines respectively connected to control gates of the preset number of memory cell transistors; and a selection gate line on the source side connected to a gate electrode of the selection gate transistor on the source side; wherein a distance C between the selection gate line at least on the source side and one of the word lines which lies adjacent to the selection gate line on the source side is set to n*A+(n−1)B, where n is an integer greater than or equal to 2, A indicates the pitch between adjacent ones of the plurality of word lines, and B indicates the width of each of the plurality of word lines.

According to a second aspect of the present invention, there is provided a semiconductor memory device comprising a memory cell array including a plurality of memory units each having a preset number of memory cell transistors which each have a stacked gate structure including a control gate and a charge storage layer and are disposed between a selection gate transistor on a drain side and a selection gate transistor on a source side; a plurality of word lines respectively connected to the control gates of the preset number of memory cell transistors of each of the plurality of memory units; selection gate lines on drain sides respectively connected to gate electrodes of the selection gate transistors on the drain sides of the plurality of memory units; and selection gate lines on source sides respectively connected to gate electrodes of the selection gate transistors on the source sides of the plurality of memory units; wherein a distance C between the selection gate line at least on the source side and one of the word lines which lies adjacent to the selection gate line on the source side is set to n*A+(n−1)B, where n is an integer greater than or equal to 2, A indicates the pitch between adjacent ones of the plurality of word lines, and B indicates the width of each of the plurality of word lines.

According to a third aspect of the present invention, there is provided a manufacturing method of a semiconductor memory device comprising sequentially forming first and second polysilicon films on a semiconductor substrate in a portion corresponding to a first region in which a selection gate line connected to a gate electrode of a selection gate transistor is formed with a gate insulating film disposed therebetween and sequentially forming the first polysilicon film, gate-gate insulating film and second polysilicon film on the semiconductor substrate in a portion corresponding to a second region which lies adjacent to the first region and in which a plurality of word lines connected to control gates of a preset number of memory cell transistors are formed with the gate insulating film disposed therebetween; forming a first mask pattern on the second polysilicon film in the first region and forming a plurality of second mask patterns with preset width and preset distance on the second polysilicon film in the second region; removing those of the second mask patterns which lie adjacent to at least the first mask pattern while a preset number of second mask patterns among the plurality of second mask patterns are left behind; and etching and removing the first polysilicon film, gate-gate insulating film and second polysilicon film with the first mask pattern and the preset number of second mask patterns which are left behind used as a mask and respectively forming the selection gate line and the plurality of word lines in the first and second regions.

BRIEF DESCRIPTION OF THE SEVERAL VIEWS OF THE DRAWING

FIG. 1 is a block diagram showing an example of the configuration of a semiconductor memory device (NAND flash memory) according to a first embodiment of this invention.

FIG. 12 is a cross-sectional view for illustrating a formation process of the memory cell array shown in FIGS. 9A and 9B.

FIG. 13 is a cross-sectional view for illustrating a formation process of the memory cell array shown in FIGS. 9A and 9B.

DETAILED DESCRIPTION OF THE INVENTION

Figure 2A:
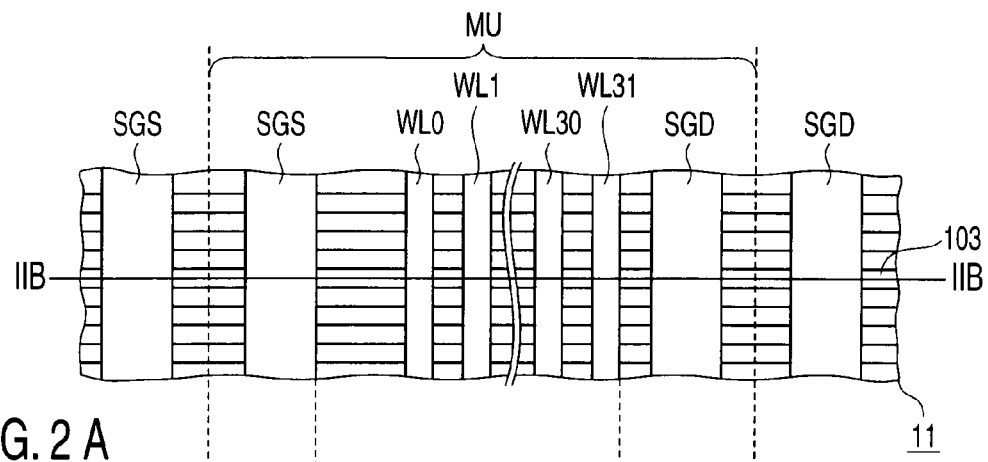
FIGS. 2A and 2B are a plan view and cross-sectional view showing an example of the structure of a memory cell array of the NAND flash memory shown in FIG. 1.

Embodiments of the present invention will be described with reference to the accompanying drawings. It should be noted that the drawings are schematic ones and the dimension ratios shown therein are different from the actual ones. The dimensions vary from drawing to drawing and so do the ratios of the dimensions. The following embodiments are directed to a device and a method for embodying the technical concept of the present invention and the technical concept does not specify the material, shape, structure or configuration of components of the present invention. Various changes and modifications can be made to the technical concept without departing from the spirit or scope of the claimed invention.

FIRST EMBODIMENT

FIG. 1 shows an example of the configuration of a semiconductor memory device according to a first embodiment of this invention. In the present embodiment, a case wherein a NAND flash memory is applied to a nonvolatile memory device as an example is explained.

In FIG. 1, a memory cell array 11 is configured to include a plurality of flash memory cells (NAND cells) (not shown). A column control circuit 12 and row control circuit 13 are provided near the memory cell array 11. The column control circuit 12 controls bit lines to erase data held in the memory cell, write data into the memory cell or read out data from the memory cell. The row control circuit 13 selectively applies voltages required for erase, write and read operations to a cell word line and selection gate line.

Further, a source line control circuit 14 that controls the potential of a source line and a P-well control circuit 15 that controls the potential of a p-type well (P-well) in which the memory cell array 11 is formed are provided near the memory cell array 11.

A data input/output buffer 16 is connected to an external host (controller) 21 via an external input/output (I/O) line to receive write data, address data and command data from the host 21 and output read data to the host 21. That is, the data input/output buffer 16 supplies write data received from the host 21 via the external I/O line to the column control circuit 12. Further, it receives read data read out from the memory cell array 11 from the column control circuit 12 and outputs the same to the host 21 via the external I/O line. In addition, it supplies address data and command data from the host 21 to a command interface 17 for selection of the memory cell.

The command interface 17 receives an external control signal from the host 21, determines whether data received from the data input/output buffer 16 is command data or address data and then transfers the received data to a state machine 18.

The state machine 18 controls the whole portion of the flash memory (chip). In other words, it controls the read, write and erase operations and manages the data input/output operation according to command data from the host 21. For example, the state machine 18 supplies address data received from the command interface 17 to the column control circuit 12 and row control circuit 13.

Figure 2B:
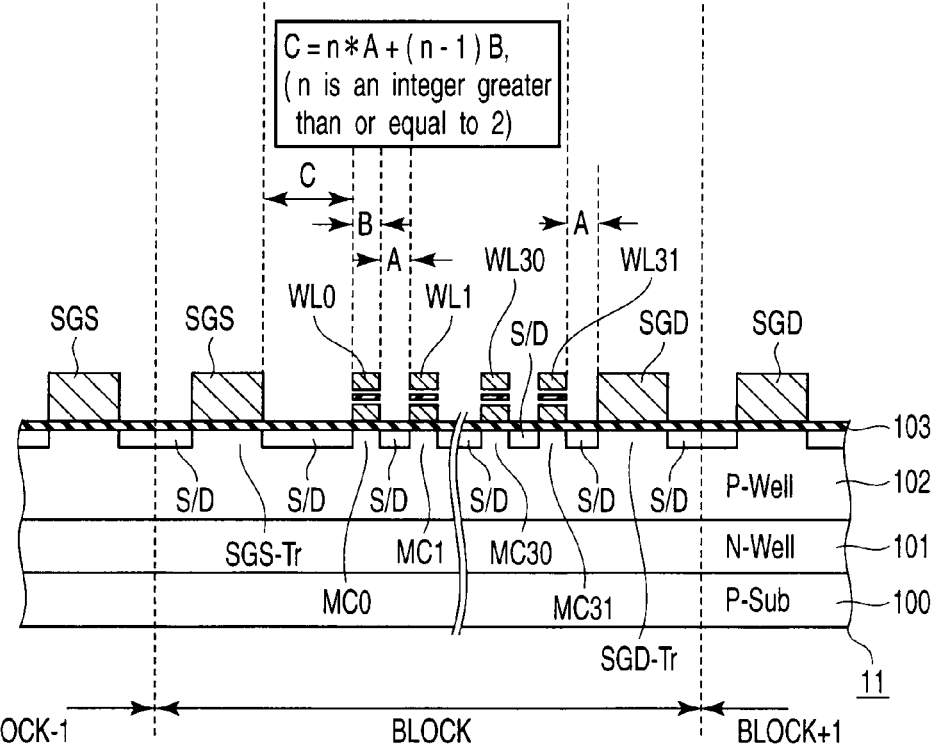

FIGS. 2A and 2B show an example of the structure of the memory cell array 11. FIG. 2A is a plan view showing the main portion of the memory cell array 11 and FIG. 2B is a cross-sectional view taken along line IIB-IIB of FIG. 2A.

For example, the internal portion of the memory cell array 11 is divided into a plurality of blocks BLOCKn. Each block BLOCKn is a minimum unit that can be simultaneously erased. Each block BLOCKn has a plurality of NAND memory units (that are also referred to as NAND strings) MU arranged in the row direction. Each NAND memory unit is configured to include a NAND string in which a preset number of (for example, 32) memory cells MC0 to MC31 are serially connected. One-side ends of the NAND strings are connected to a bit line (not shown) via respective selection gate transistors SGD-Tr on the drain sides. The other ends of the NAND strings are connected to a common source line (not shown) via selection gate transistors SGS-Tr on the source sides. That is, each NAND memory unit MU includes the 32 memory cells MC0 to MC31 and the two selection gate transistors SGD-Tr and SGS-Tr that are arranged to sandwich the 32 memory cells MC0 to MC31.

The gate electrodes of the selection gate transistors SGD-Tr of the NAND memory units MU are commonly connected to a selection gate line SGD on the drain side. Further, the gate electrodes of the selection gate transistors SGS-Tr are commonly connected to a selection gate line SGS on the source side.

In this example, each of the memory cells MC0 to MC31 is a MOS transistor having a double-layered stacked gate electrode structure that has a floating gate electrode and a control gate electrode. The memory cells MC0 to MC31 are arranged (serially connected) in each NAND string while adjacent ones of the memory cells MC0 to MC31 commonly use a diffusion region (n-type) S/D acting as a source or drain. In each of the memory cells MC0 to MC31, the data rewriting operation (write and erase operations) is performed by charging and discharging charges (hot-electrons) with respect to the floating gate electrode by using an FN tunnel current. Generally, the state in which hot-electrons are injected and held in the floating gate electrode is set as a 0-write state and the state in which hot-electrons are not injected is set as a 1-write state.

Further, the gate electrodes of the 32 memory cells MC0 to MC31 of the NAND memory units MU are respectively connected to common cell word lines WLi (i=0 to 31). The cell word lines WLi are cell word lines WL0, WL1, . . . , WL30, WL31 in the order from the source side.

The blocks BLOCKn adjacent in the column direction are arranged with the selection gate transistors SGD-Tr thereof set adjacent to each other on one hand and arranged with the selection gate transistors SGS-Tr thereof set adjacent to each other on the other hand.

In the case of this embodiment, in each block BLOCKn, the source-side selection gate line SGS configuring the NAND memory unit MU and the cell word line WL0 adjacent thereto are arranged to satisfy at least the condition of $C=n*A+(n-1)B$, where n is an integer greater than or equal to 2. In this case, A indicates the distance (space) between adjacent ones of the cell word lines WL0 to WL31, B indicates the width (line) of each of the cell word lines WL0 to WL31, and C is the distance between the source-side selection gate line SGS and the cell word line WL0. By arranging the source-side selection gate line SGS and the cell word line WL0 so as to satisfy the above condition, occurrence of a defect due to a GIDL current can be avoided. In addition, a resist pattern finely processed to the limit of exposure of an exposure device (not shown) used for processing the cell word lines WL0 to WL31 can be stably formed. Therefore, the manufacturing yield and the reliability of the memory cells MC0 to MC31 can be sufficiently made high.

The above condition is based on the principle of the exposure device and, for example, a dummy resist pattern that maintains the repetitiveness of pitches (lines & spaces) of the cell word lines WL0 to WL31 is previously formed between the source-side selection gate line SGS and the cell word line WL0. Then, the source-side selection gate line SGS configuring the NAND memory unit MU and the cell word line WL0 adjacent thereto can be formed with high controllability by using a method of separating the dummy resist pattern before gate electrodes are processed.

Next, a process for forming the source-side selection gate line SGS and the cell word line WL0 adjacent thereto with high controllability based on the principle of the exposure device is specifically explained with reference to FIGS. 3 to 6. In this example, a case wherein one NAND memory unit MU is taken as an object is explained.

Figure 3:
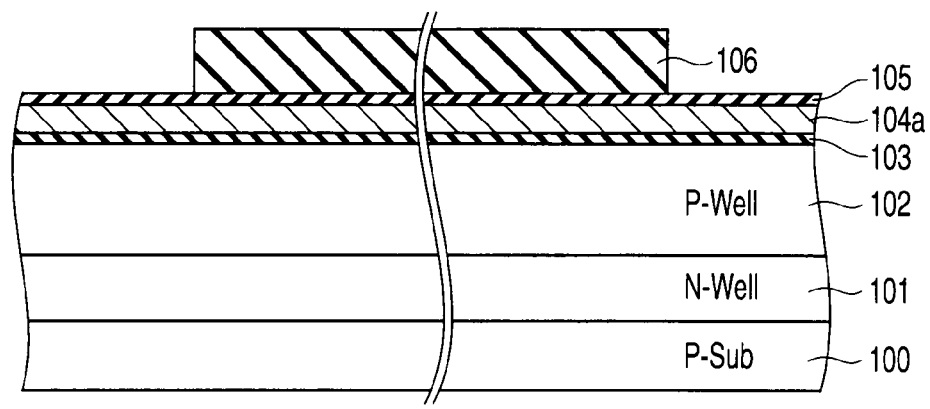
FIG. 3 is a cross-sectional view for illustrating a formation process of the memory cell array shown in FIGS. 2A and 2B.

First, for example, as shown in FIG. 3, an n-type well (N-Well) 101 and p-type well (P-Well) 102 are sequentially formed on the surface portion of a P-type silicon substrate (P-Sub) 100 by use of a known ion-implantation method and diffusion method. Then, a tunnel insulating film 103 used as a first gate insulating film is formed above the surface of the P-Sub 100. After a polysilicon film 104a used as a floating gate electrode is formed on the tunnel insulating film 103, a gate-gate insulating film 105 formed of a laminated film of ONO (oxide film/nitride film/oxide film) is formed on the resultant structure as a second gate insulating film. After this, a mask pattern 106 that contains at least a region in which cell word lines WL0 to WL31 are to be formed (at least regions in which selection gate lines SGS, SGD are to be formed are opened) is formed.

Figure 4:
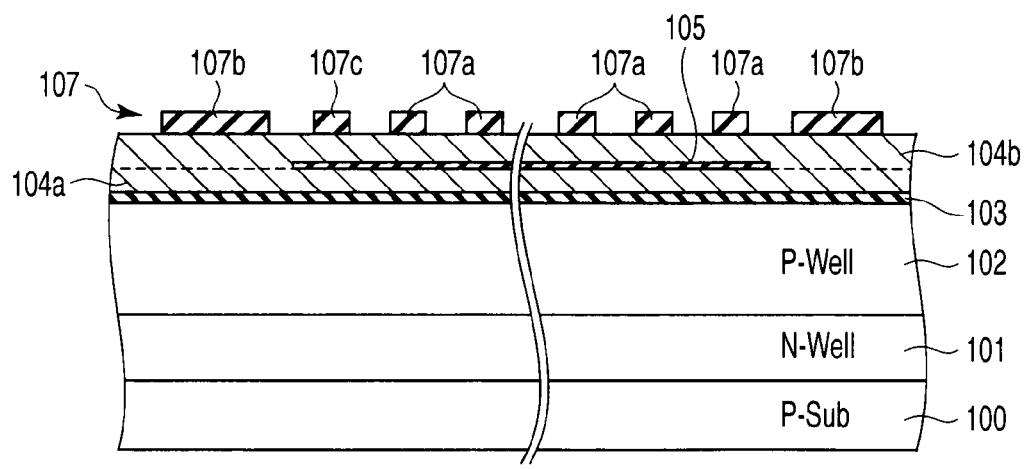
FIG. 4 is a cross-sectional view for illustrating a formation process of the memory cell array shown in FIGS. 2A and 2B.

Next, for example, as shown in FIG. 4, portions of the gate-gate insulating film 105 that lie in the regions in which the selection gate lines SGS, SGD are to be formed are separated with the mask pattern 106 used as a mask. Then, after the mask pattern 106 is removed, a polysilicon film 104b used as a control gate electrode is formed again. After this, a silicon nitride (SiN) film is uniformly formed on the polysilicon film 104b.

Next, a photoresist film (not shown) is uniformly formed on the SiN film and a desired resist pattern is formed by use of the exposure technique. Then, the SiN film is etched to form a mask pattern 107 as shown in the drawing with the resist pattern used as a mask.

In the case of this embodiment, the mask pattern 107 is formed to include mask patterns 107a, mask patterns 107b and dummy mask pattern 107c. The mask patterns 107a are mask patterns for formation of the cell word lines WL0 to WL31 that are formed with the constant lines & spaces in the region for formation of the cell word lines WL0 to WL31. The mask patterns 107b are mask patterns for formation of the selection gate lines SGS, SGD that are formed in the regions for formation of the selection gate lines SGS, SGD. The dummy mask pattern 107c is a mask patterns that is formed with the same line & space as that between adjacent ones of the cell word lines WL0 to WL31 between at least the source-side selection gate line SGS and the cell word line WL0 adjacent thereto. Thus, the mask patterns 107a lying in the region for formation of the cell word lines WL0 to WL31 that contain the dummy mask pattern 107c between the selection gate lines SGS and SGD are formed of resist patterns having constant repetitiveness. Therefore, a stable exposure focus margin can be attained and the mask pattern 107 can be formed with high controllability. As a result, the cell word lines WL0 to WL31 processed by use of the mask pattern 107 can be formed with the stable and highly precise dimensions.

Generally, the selection gate transistors SGD-Tr, SGS-Tr are formed to have greater channel lengths (widths) than those of the cell word lines WL0 to WL31 as the selection gate lines SGD, SGS used as gate electrodes in order to attain a desired cut-off characteristic. Therefore, the repetitiveness of the mask pattern 107 is slightly disturbed on the source and drain sides. As a result, the dimension (processing) controllability of the dummy mask pattern 107c is slightly reduced in comparison with the mask patterns 107a. However, the dummy mask pattern 107c is separated in a later step without being used for formation of the cell word lines WL0 to WL31. Therefore, the cell word lines WL0 to WL31 can be formed with stable precision.

Figure 5:
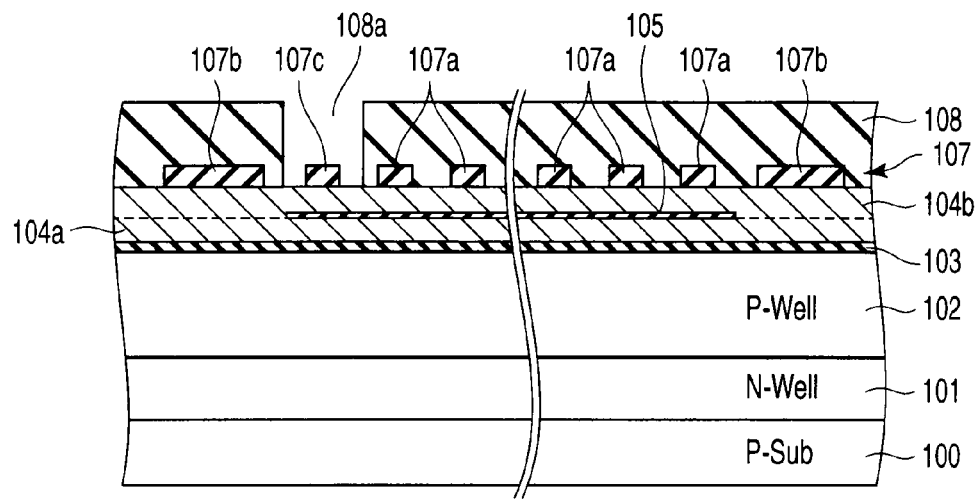
FIG. 5 is a cross-sectional view for illustrating a formation process of the memory cell array shown in FIGS. 2A and 2B.

Next, for example, as shown in FIG. 5, an SiN film is uniformly formed on the polysilicon film 104b and the mask pattern 107. Then, the SiN film is etched and processed to form a desired mask pattern 108. The mask pattern 108 masks the region for formation of the cell word lines WL0 to WL31 and the regions for formation of the selection gate lines SGS, SGD and an opening portion 108a is formed only in a portion for formation of the dummy mask pattern 107c.

Next, the dummy mask pattern 107c is removed by etching with the mask pattern 108 used as a mask.

Figure 6:
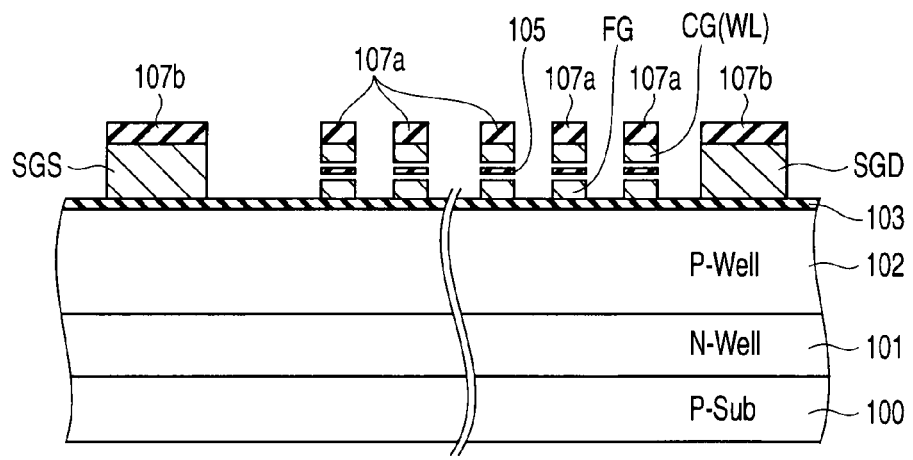
FIG. 6 is a cross-sectional view for illustrating a formation process of the memory cell array shown in FIGS. 2A and 2B.

Next, for example, as shown in FIG. 6, after the mask pattern 108 is removed, the polysilicon films 104a, 104b and gate-gate insulating film 105 are etched and processed with the mask patterns 107a, 107b used as a mask to form gate electrode patterns of the memory cells MC0 to MC31 and selection gate transistors SGD-Tr, SGS-Tr. The gate electrode patterns of the memory cells MC0 to MC31 have structures in which floating gate electrodes FG, gate-gate insulating films 105 and control gate electrodes (cell word lines WL0 to WL31) CG are laminated on the tunnel insulating film 103 and the cell word lines WL0 to WL31 are formed with constant repetitiveness. The gate electrode patterns of the selection gate transistors SGD-Tr, SGS-Tr, that is, the selection gate lines SGD, SGS are formed with structures that have greater channel lengths (widths) than those of the cell word lines WL0 to WL31 and formed to have the distance C (=n*A+(n−1)B, where n is an integer greater than or equal to 2) between the selection gate line SGS and the cell word line WL0 that is longer than the distance between the selection gate line SGD and the cell word line WL31.

After this, the memory cell array 11 with the structure shown in FIGS. 2A and 2B is obtained by performing a known process.

As described above, the distance C=n*A+(n−1)B, where n is an integer greater than or equal to 2, is set at least between the selection gate line SGS and the cell word line WL0 adjacent thereto. That is, when the distance between the adjacent ones of the cell word lines WL0 to WL31 is set to A and the width of each of the cell word lines WL0 to WL31 is set to B, the selection gate line SGS and the cell word line WL0 adjacent thereto are arranged with the distance C=n*A+(n−1)B therebetween, where n is an integer greater than or equal to 2. As a result, a defect of injecting hot-electrons into the floating gate electrode FG of the memory cell MC0 corresponding to the cell word line WL0 by a GIDL current caused by the potential transferred to the selection gate line SGS at the data write operation time can be avoided and data can be prevented from being destroyed.

Particularly, in the case of this embodiment, the distance C=n*A+(n−1)B, where n is an integer greater than or equal to 2, can be set between the selection gate line SGS and the cell word line WL0 with high controllability by removing the dummy mask pattern 107c that lies adjacent to the source-side selection gate line SGS. That is, the high processing controllability of the cell word lines WL0 to WL31 can be attained since the distance C=n*A+(n−1)B, where n is an integer greater than or equal to 2, is based on the principle of the exposure device. Therefore, an increase in the threshold value (Vth) distribution width after writing or erasing of the memory cells MC0 to MC31 due to disturbance in the process in the width direction of the cell word lines WL0 to WL31 can be prevented and the manufacturing yield and the reliability of the memory cells MC0 to MC31 can be enhanced.

SECOND EMBODIMENT

Figure 7A:
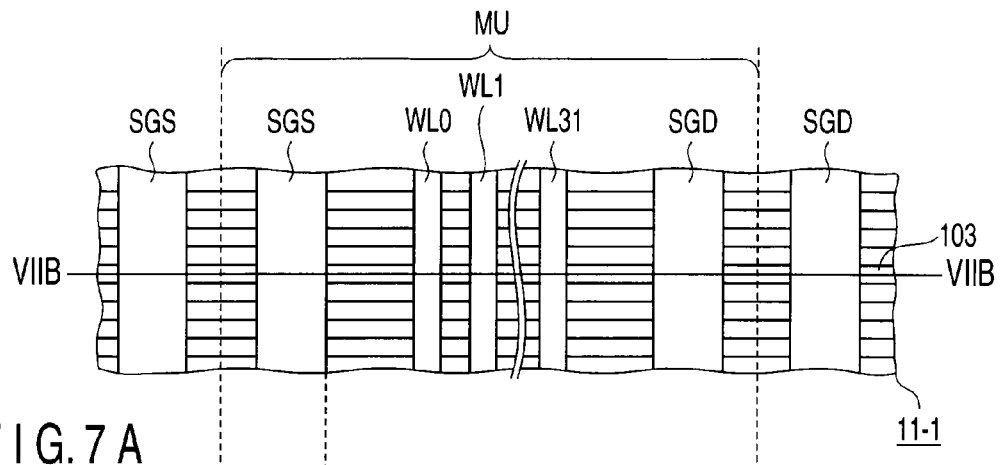
FIGS. 7A and 7B are a plan view and cross-sectional view showing an example of the structure of a memory cell array of a semiconductor memory device (NAND flash memory) according to a second embodiment of this invention.
Figure 7B:
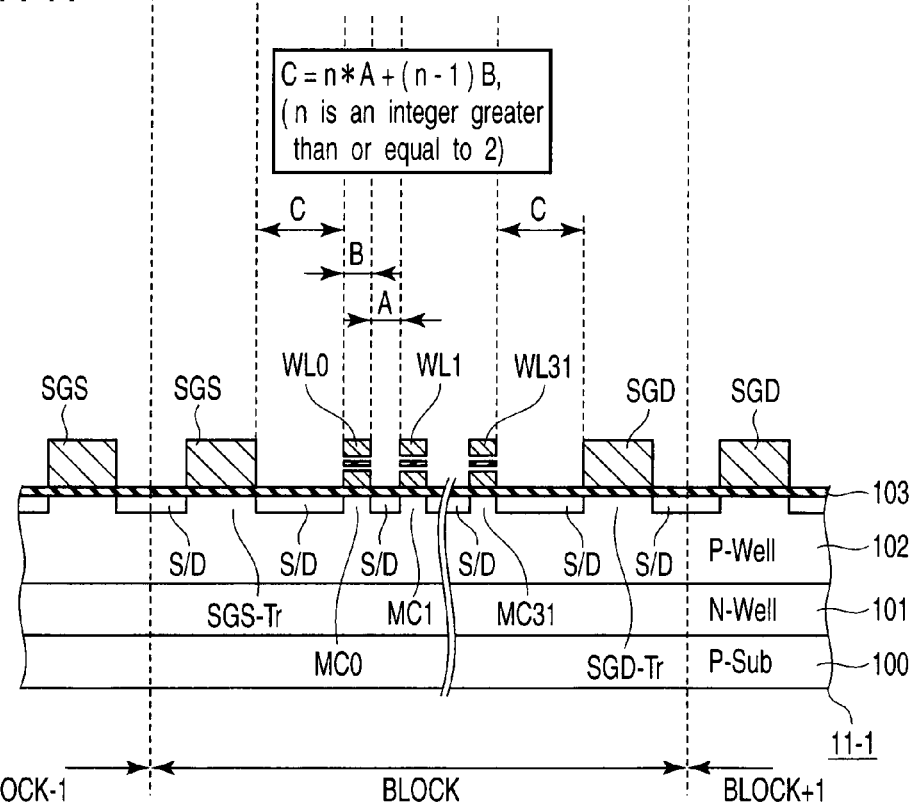

FIGS. 7A and 7B show an example of the structure of a semiconductor memory device according to a second embodiment of this invention. FIG. 7A is a plan view showing the main portion of a memory cell array 11-1 when a NAND flash memory is taken as an example and FIG. 7B is a cross-sectional view taken along line VIIB-VIIB of FIG. 7A. Portions that are the same as those of the first embodiment are denoted by the same reference symbols and the detail explanation thereof is omitted.

In the case of this embodiment, the distance C n*A+(n−1)B, where n is an integer greater than or equal to 2, is set between a source-side selection gate line SGS and a cell word line WL0 adjacent thereto and between a drain-side selection gate line SGD and a cell word line WL31 adjacent thereto. That is, in the first embodiment, a case wherein the distance C=n*A+(n−1)B, where n is an integer greater than or equal to 2, is set only between the cell word line WL0 and the source-side selection gate line SGS is explained. For example, it is also possible to set the distance C=n*A+(n−1)B, where n is an integer greater than or equal to 2, between the cell word line WL31 and the drain-side selection gate line SGD.

Figure 8:
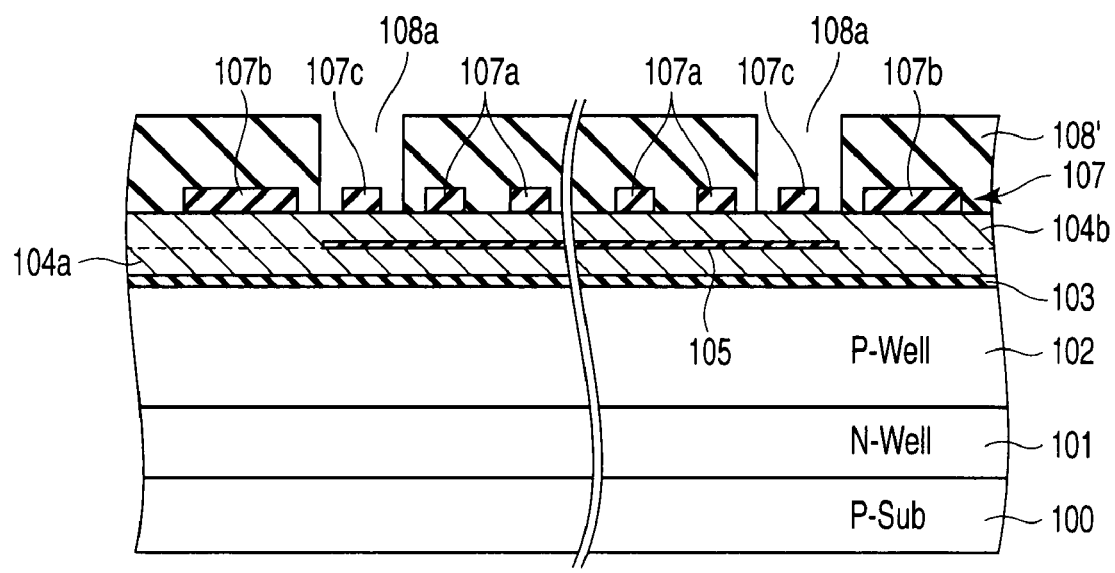
FIG. 8 is a cross-sectional view for illustrating a formation process of the memory cell array shown in FIGS. 7A and 7B.

The memory cell array 11-1 with the above configuration is formed to have a dummy mask pattern 107c also formed in a region corresponding to a portion between the cell word line WL31 and the drain-side selection gate line SGD in the step of FIG. 4, for example. After this, for example, as shown in FIG. 8, a mask pattern 108' having opening portions 108a, 108a formed in forming portions of the dummy mask patterns 107c, 107c is formed. Then, a region for formation of the cell word lines WL0 to WL31 and regions for formation of the selection gate lines SGS, SGD are masked with the mask pattern 108' and the dummy mask patterns 107c, 107c are removed by etching.

After this, the memory cell array 11-1 with the structure shown in FIGS. 7A and 7B can be attained by performing a known process.

As a result, it becomes possible to configure a NAND flash memory having the memory cell array 11-1 in which the distance C=n*A+(n−1)B, where n is an integer greater than or equal to 2, is set between the cell word line WL0 and the source-side selection gate line SGS and between the cell word line WL31 and the drain-side selection gate line SGD. Substantially the same effect as that of the NAND flash memory with the configuration shown in the first embodiment can be attained by use of the NAND flash memory with the above configuration. That is, not only for the cell word line WL0 adjacent to the source-side selection gate line SGS but also for the cell word line WL31 adjacent to the drain-side selection gate line SGD, a defect of injecting hot-electrons into the floating gate electrode FG of the corresponding memory cell MC31 by a GIDL current caused by the potential transferred to the selection gate line SGD at the data write operation time can be avoided and data can be prevented from being destroyed.

Further, the mask patterns 107a that lie in the region for formation of the cell word lines WL0 to WL31 except the regions for formation of the dummy mask patterns 107c, 107c to be separated are formed by use of a resist pattern in which an exposure focus margin is attained for stable resist-processing on the lithography technique. Therefore, an increase in the threshold value (Vth) distribution width after writing or erasing of the memory cells MC0 to MC31 due to disturbance in the process in the width direction of the cell word lines WL0 to WL31 can be prevented and the manufacturing yield and the reliability of the memory cells MC0 to MC31 can of course be enhanced.

THIRD EMBODIMENT

Figures 9A, 9B:
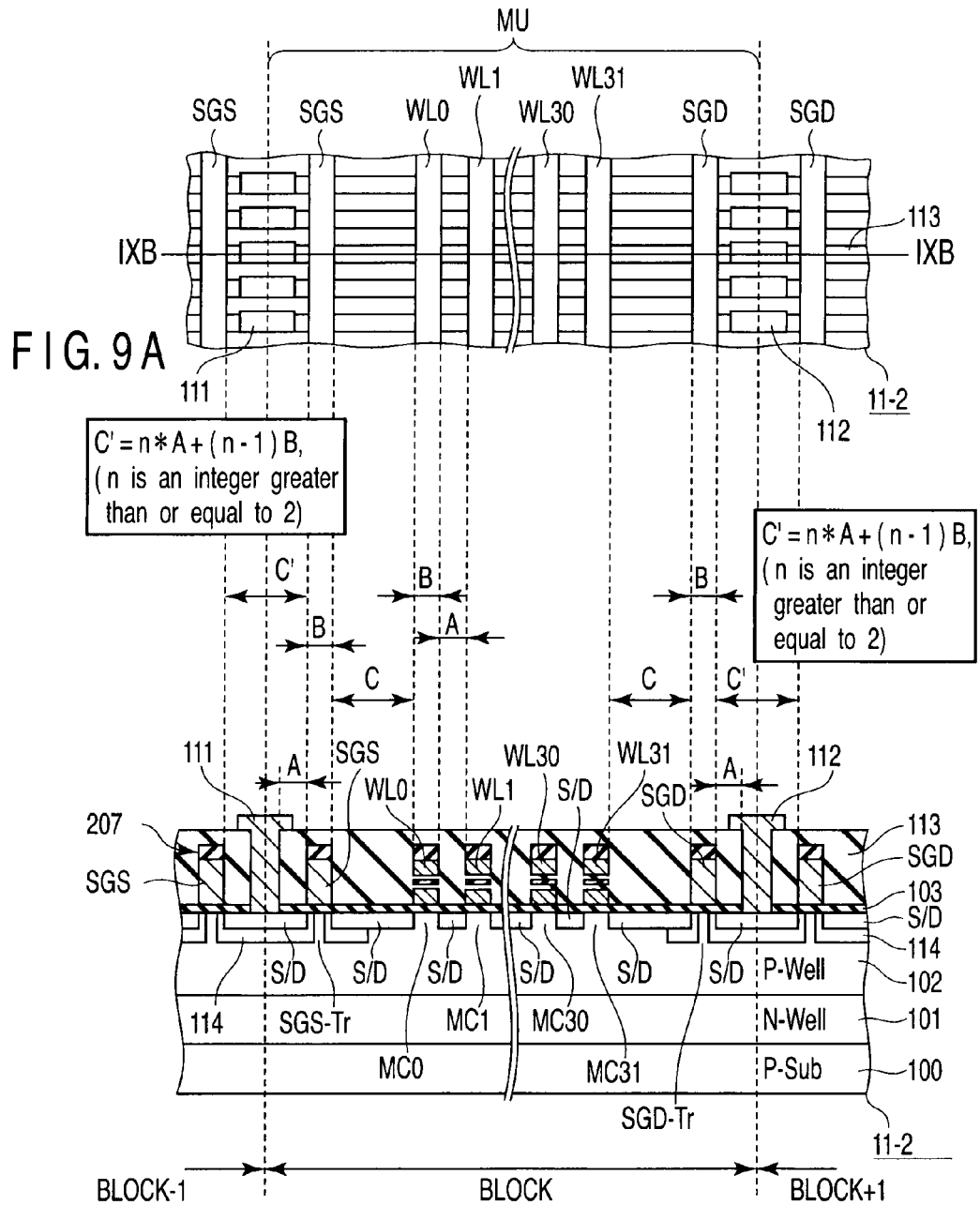
FIGS. 9A and 9B are a plan view and cross-sectional view showing an example of the structure of a memory cell array of a semiconductor memory device (NAND flash memory) according to a third embodiment of this invention.

FIGS. 9A and 9B show an example of the structure of a semiconductor memory device according to a third embodiment of this invention. In the present embodiment, a case wherein selection gate lines SGD, SGS are formed to have structures in which the channel lengths (widths) thereof are set to the same as those of cell word lines WL0 to WL31 is explained. FIG. 9A is a plan view showing the main portion of a memory cell array 11-2 when a NAND flash memory is taken as an example and FIG. 9B is a cross-sectional view taken along line IXB-IXB of FIG. 9A. Portions that are the same as those of the second embodiment are denoted by the same reference symbols and the detail explanation thereof is omitted.

In the case of this embodiment, the cell word lines WL0 to WL31 are arranged with the distance therebetween set to A and with the width thereof set to B and the selection gate lines SGD, SGS are arranged with the width thereof set to B while the distances between the selection gate lines SGD, SGS and the cell word lines WL0, WL31 respectively adjacent thereto are set to C=n*A+(n−1)B, where n is an integer greater than or equal to 2. Further, the adjacent source-side selection gate lines SGS, SGS are arranged between the adjacent blocks BLOCK and BLOCK-1 with the distance C'=n*A+(n−1)B, where n is an integer greater than or equal to 2. Likewise, the adjacent drain-side selection gate lines SGD, SGD are arranged between the adjacent blocks BLOCK and BLOCK+1 with the distance C'=n*A+(n−1)B, where n is an integer greater than or equal to 2. A source line contact 111 is arranged in position separated from each of the selection gate lines SGS, SGS by A between the adjacent source-side selection gate lines SGS and SGS and a bit line contact 112 is arranged in position separated from each of the selection gate lines SGD, SGD by A between the adjacent drain-side selection gate lines SGD and SGD. The source line contact 111 and bit line contact 112 are formed to pass through an electrode-electrode insulating film 113. P-layers 114 are selectively formed on the surface of a P-Sub 100 around the selection gate transistors SGD-Tr, SGS-Tr by use of a shallow ion-implantation method.

That is, in the third embodiment, the distance C' between the source-side selection gate lines SGS and SGS of the NAND memory units MU that lie adjacent in the bit line direction and the distance C' between the drain-side selection gate lines SGD and SGD are set to satisfy the relation of n*A+(n−1)B based on the width B of the cell word lines WL0 to WL31 and the distance A between the cell word lines WL0 to WL31.

Next, a process of forming the memory cell array 11-2 having the above configuration with high controllability is specifically explained with reference to FIGS. 10 to 13.

First, an n-type well (N-well) 101 and p-type well (P-well) 102 are sequentially formed on the surface portion of a P-type silicon substrate (P-sub) 100 by use of a known ion-implantation method and diffusion method. Then, a tunnel insulating film 103 used as a first gate insulating film is formed above the surface of the P-Sub 100. A polysilicon film 104a is formed on the tunnel insulating film 103 and then a gate-gate insulating film 105 is formed on the resultant structure as a second gate insulating film.

After this, a mask pattern (not shown) that contains at least a region in which cell word lines WL0 to WL31 are to be formed (at least regions in which selection gate lines SGS, SGD are to be formed are opened) is formed. Then, portions of the gate-gate insulating film 105 that lie in the regions in which the selection gate lines SGS, SGD are to be formed are separated with the above mask pattern used as a mask. After the mask pattern is removed, a polysilicon film 104b is formed again. After this, an SiN film is uniformly formed on the polysilicon film 104b.

Figure 10:
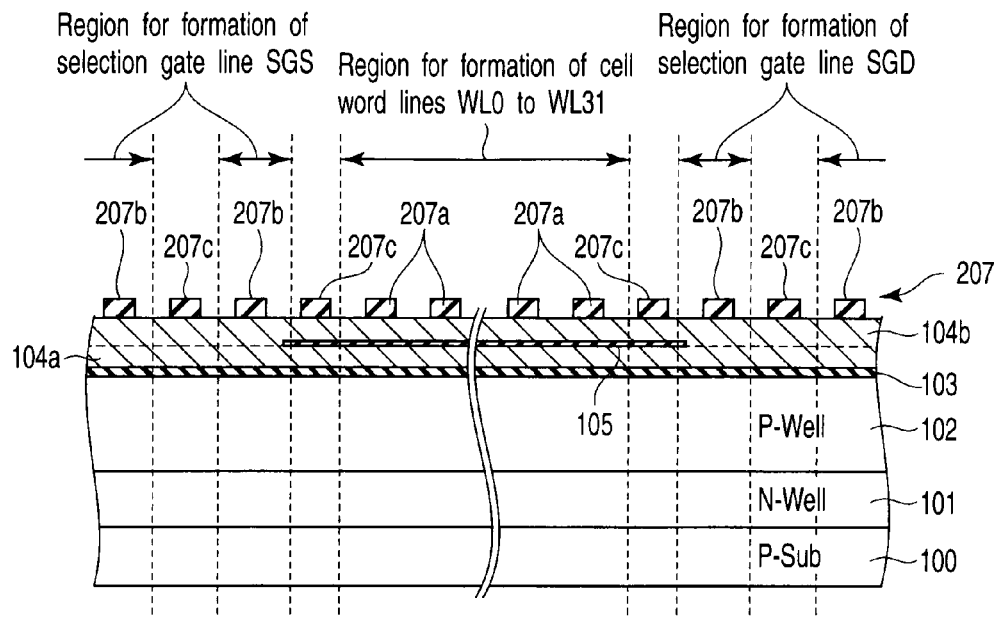
FIG. 10 is a cross-sectional view for illustrating a formation process of the memory cell array shown in FIGS. 9A and 9B.

Next, a resist pattern (not shown) is formed on the SiN film by use of an exposure technique and a desired mask pattern 207 is formed by etching and processing the SiN film with the resist pattern used as a mask (FIG. 10). In this case, the desired mask pattern 207 is formed to include mask patterns 207a in the region for formation of the cell word lines WL0 to WL31, mask patterns 207b in the regions for formation of the selection gate lines SGS, SGD, and dummy mask patterns 207c that respectively lie between the source-side selection gate line SGS and the cell word line WL0 adjacent thereto, between the drain-side selection gate line SGD and the cell word line WL31 adjacent thereto, between the adjacent source-side selection gate lines SGS, SGS and between the adjacent drain-side selection gate lines SGD, SGD. The mask patterns 207a in the region for formation of the cell word lines WL0 to WL31 are formed with constant lines (B) and spaces (A). The mask patterns 207b and dummy mask patterns 207c are formed with the same lines and spaces as those of the cell word lines WL0 to WL31. Thus, the mask patterns 207a in the region for formation of the cell word lines WL0 to WL31 including the dummy mask patterns 207c and the mask patterns 207b lying in the regions for formation of the selection gate lines SGS, SGD are formed of resist patterns having constant repetitiveness. Therefore, a stable exposure focus margin can be attained and the mask pattern 207 can be formed with high controllability. As a result, the cell word lines WL0 to WL31 and the selection gate lines SGS, SGD processed by use of the mask pattern 207 can be formed with the stable and highly precise dimensions.

Figure 11:
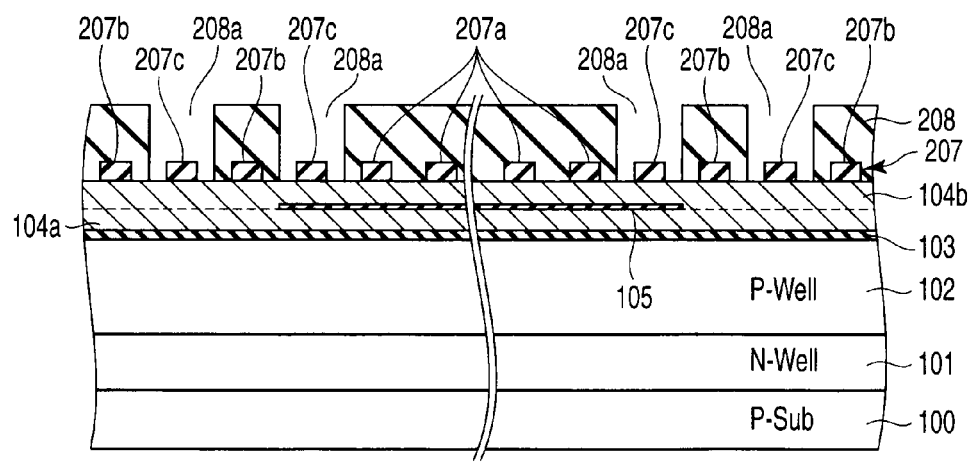
FIG. 11 is a cross-sectional view for illustrating a formation process of the memory cell array shown in FIGS. 9A and 9B.

Next, an SiN film is uniformly formed on the polysilicon film 104b and the mask pattern 207. Further, the SiN film is processed by etching to form a desired mask pattern 208 (FIG. 11). The mask pattern 208 is formed to mask the region for formation of the cell word lines WL0 to WL31 and the regions for formation of the selection gate lines SGS, SGD and opening portions 208a are formed only in formation portions of the dummy mask patterns 207c.

Next, the dummy mask patterns 207c are removed by etching with the mask pattern 208 used as a mask.

After the mask pattern 208 is removed, the polysilicon films 104a, 104b and the gate-gate insulating film 105 are processed by etching with the mask patterns 207a, 207b used as a mask to form gate electrode patterns (cell word lines WL0 to WL31) of the memory cells MC0 to MC31 and gate electrode patterns (selection gate lines SGS, SGD) of the selection gate transistors SGD-Tr, SGS-Tr. Then, a desired mask pattern 209 is formed to cover at least the region for formation of the cell word lines WL0 to WL31. After this, boron (B) as a p-type impurity is doped with energy of approximately 10 keV, 3E12 ($3 \times 10^{12}$), for example, to form P-layers 114 on the surface of the P-Sub 100 with the mask pattern 209 used as a mask (FIG. 12).

In the case of this embodiment, the selection gate lines SGS, SGD are formed with the same widths (the same channel lengths) as those of the cell word lines WL0 to WL31. Therefore, the threshold values of the selection gate transistors SGD-Tr, SGS-Tr can be enlarged and a desired cut-off characteristic (selection gate transistor characteristic) can be attained by surrounding the diffusion layers (S/D) configuring the memory cells MC0 to MC31 with diffusion layers (P-layers 114) having a certain concentration. That is, the P-layer 114 is an impurity region formed to attain the desired selection gate transistor characteristic.

Next, after the mask pattern 209 is removed, n-type diffusion regions S/D acting as source or drain regions are formed and an electrode-electrode insulating film 113 is formed. Then, a source line contact (for example, a WSi film) 111 is formed between the adjacent source-side selection gate lines SGS and SGS and a bit line contact (for example, a WSi film) 112 is formed between the adjacent drain-side selection gate lines SGD and SGD (FIG. 13). The surface portion of the electrode-electrode insulating film 113 is removed by etching and the upper portions of the source line contact 111 and bit line contact 112 are exposed.

After this, the memory cell array 11-2 with the structure shown in FIGS. 9A and 9B can be attained by performing a known process.

According to the configuration of the present embodiment, the cell word lines WL0 to WL31 and selection gate lines SGS, SGD can be processed with extremely stable and highly controllable dimensions. That is, the cell word lines WL0 to WL31 and selection gate lines SGS, SGD are formed with constant repetitiveness (lines & spaces). Further, the distance $C=n*A+(n-1)B$, where n is an integer greater than or equal to 2, can be attained between the selection gate lines SGS, SGD and the cell word lines WL0, WL31 respectively adjacent thereto by providing dummy mask patterns with constant repetitiveness between the selection gate lines SGS, SGD and the cell word lines WL0, WL31. Therefore, a defect of injecting hot-electrons into the floating gate electrodes FG of corresponding memory cells MC0, MC31 by GIDL currents caused by the potentials transferred to the selection gate lines SGS, SGD at the data write operation time can be avoided and data can be prevented from being destroyed.

Particularly, since the exposure focus margin used for stable resist-processing is acquired, naturally, the manufacturing yield of memory cells can be enhanced and the characteristic can be stabilized. As a result, the reliability of the NAND flash memory can be enhanced and the manufacturing cost thereof can be reduced.

FOURTH EMBODIMENT

Figures 14A, 14B:
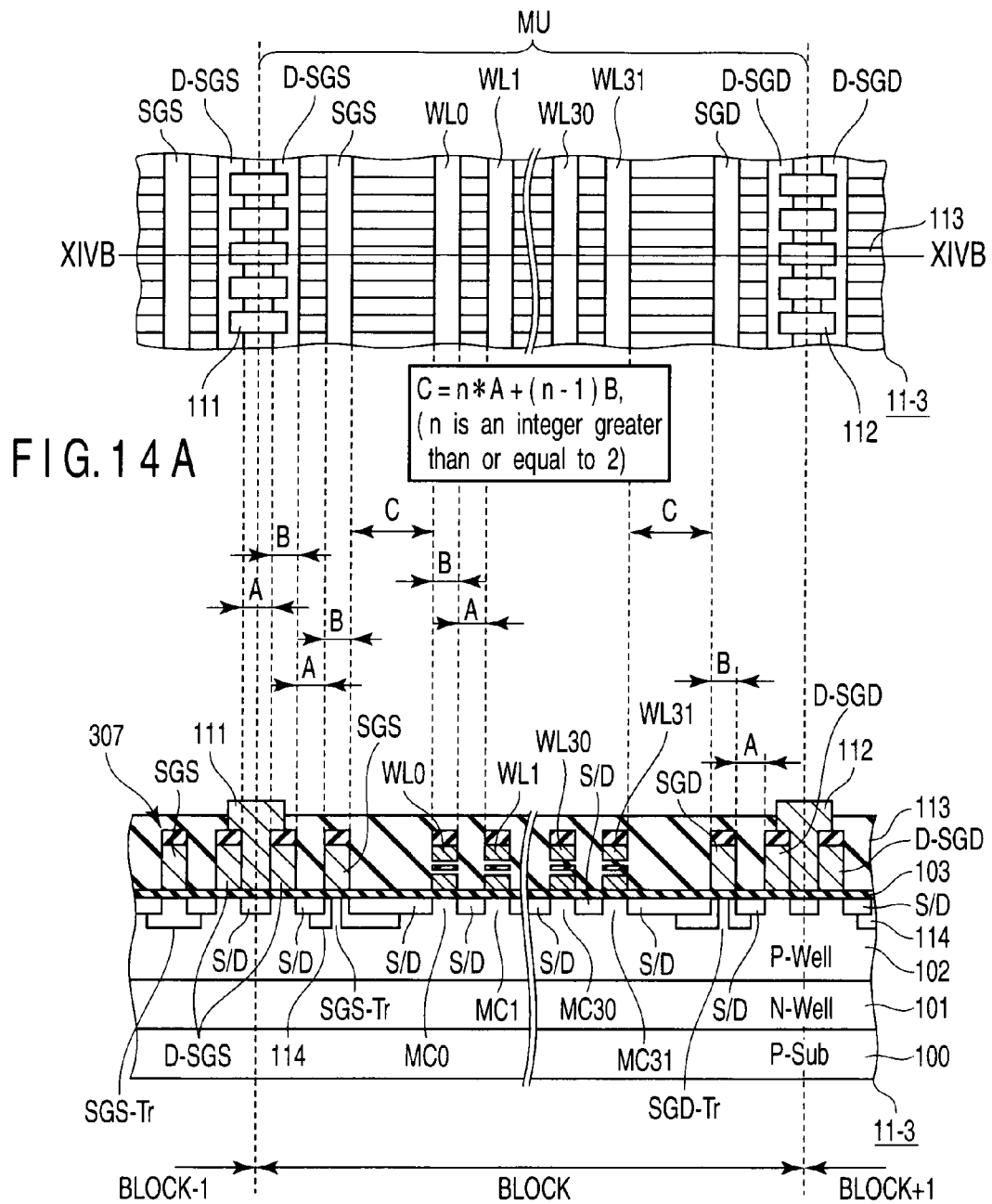
FIGS. 14A and 14B are a plan view and cross-sectional view showing an example of the structure of a memory cell array of a semiconductor memory device (NAND flash memory) according to a fourth embodiment of this invention.

FIGS. 14A and 14B show an example of the structure of a semiconductor memory device according to a fourth embodiment of this invention. In the present embodiment, another example of the structure in which the selection gate lines SGS, SGD are formed with the same channel lengths (widths) as those of the cell word lines WL0 to WL31 is explained. FIG. 14A is a plan view showing the main portion of a memory cell array 11-3 when a NAND flash memory is taken as an example and FIG. 14B is a cross-sectional view taken along line XIVB-XIVB of FIG. 14A. Portions that are the same as those of the third embodiment are denoted by the same reference symbols and the detail explanation thereof is omitted.

In the case of this embodiment, the cell word lines WL0 to WL31 are arranged with the distance therebetween set to A and with the width thereof set to B and the selection gate lines SGD, SGS are set with the width thereof set to B while the distances between the selection gate lines SGD, SGS and the cell word lines WL0, WL31 respectively adjacent thereto are set to $C=n*A+(n-1)B$, where n is an integer greater than or equal to 2. Further, dummy selection gate lines (polysilicon interconnection layer used as a contact hole forming stopper film) D-SGS, D-SGS are formed with a distance A between the adjacent source-side selection gate lines SGS, SGS between the adjacent blocks BLOCK and BLOCK-1 and a source line contact 111 is arranged between the dummy selection gate lines D-SGS, D-SGS. Likewise, dummy selection gate lines D-SGD, D-SGD are provided with a distance A between the adjacent drain-side selection gate lines SGD, SGD between the adjacent blocks BLOCK and BLOCK+1 and a bit line contact 112 is arranged between the dummy selection gate lines D-SGD, D-SGD. The source line contact 111 and bit line contact 112 are formed to pass through an electrode-electrode insulating film 113. P-layers 114 are selectively formed on the surface of a P-sub 100 around the selection gate transistors SGD-Tr, SGS-Tr by use of a shallow ion-implantation method.

That is, the cell word lines WL0 to WL31, selection gate lines SGS, SGS and dummy selection gate lines D-SGD, D-SGS are formed with constant repetitiveness (lines & spaces) in the NAND memory unit MU. Further, the distance $C=n*A+(n-1)B$, where n is an integer greater than or equal to 2, is attained between the selection gate lines SGS, SGD and the cell word lines WL0, WL31 respectively adjacent thereto by providing the dummy mask patterns between the selection gate lines SGS, SGD and the cell word lines WL0, WL31 with the constant repetitiveness maintained.

Next, a process of forming the memory cell array 11-3 having the above configuration with high controllability is specifically explained with reference to FIGS. 15 to 18.

First, a resist pattern (not shown) is formed on an SiN film on a polysilicon film 104b by use of an exposure technique and the SiN film is etching-processed by use of the resist pattern to form a mask pattern 307 with constant repetitiveness. The mask pattern 307 is formed to have mask patterns 307a in a region for formation of the cell word lines WL0 to WL31, mask patterns 307b in regions for formation of the selection gate lines SGS, SGD, dummy mask patterns 307c respectively formed between the source-side selection gate line SGS and the cell word line WL0 adjacent thereto and between the drain-side selection gate line SGD and the cell word line WL31 adjacent thereto and mask patterns 307d in a region for formation of the bit line contact 112 and in a region for formation of the source line contact 111. The above patterns are formed of the same pattern.

Figure 15:
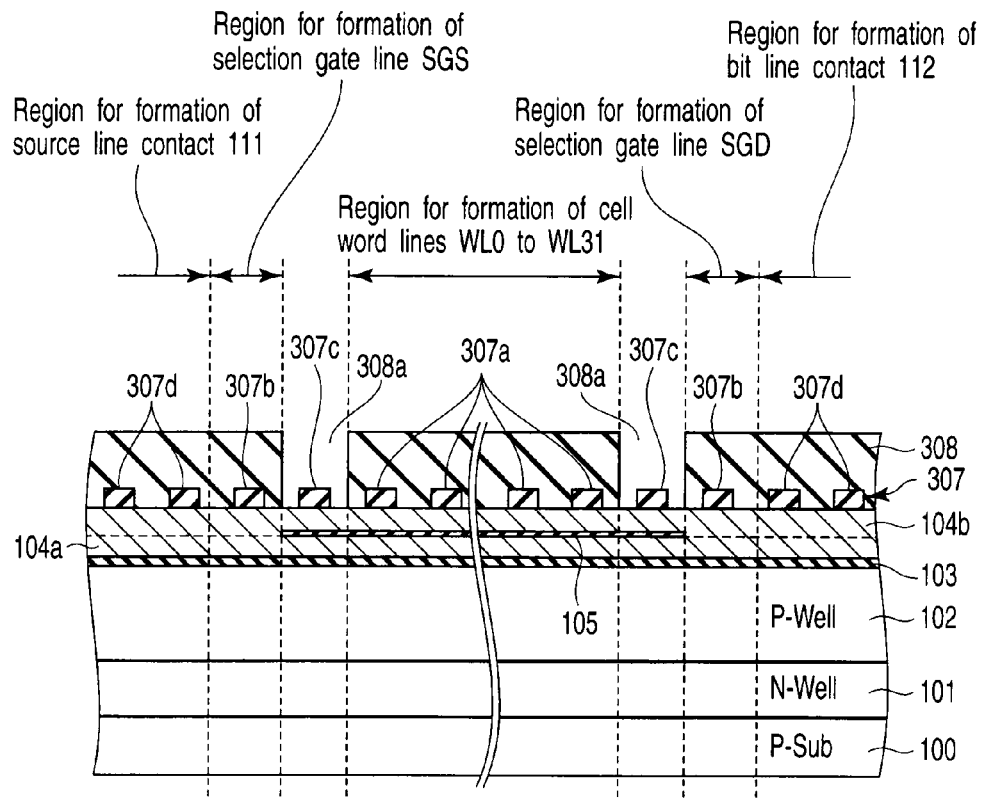
FIG. 15 is a cross-sectional view for illustrating a formation process of the memory cell array shown in FIGS. 14A and 14B.

After the above process is performed, an SiN film is uniformly formed on the polysilicon film 104b and the mask pattern 307. Then, the SiN film is processed by etching to form a desired mask pattern 308 (FIG. 15). The mask pattern 308 masks the region for formation of the cell word lines WL0 to WL31, the region for formation of the source line contact 111 and the region for formation of the bit line contact 112 and opening portions 308a are formed only in formation portions of the dummy mask patterns 307c.

Figure 16:
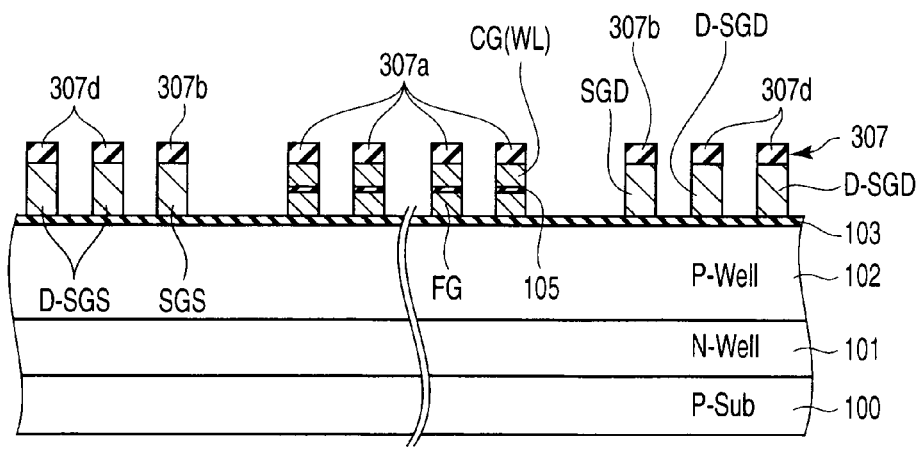
FIG. 16 is a cross-sectional view for illustrating a formation process of the memory cell array shown in FIGS. 14A and 14B.

Next, the dummy mask patterns 307c are removed by etching with the mask pattern 308 used as a mask. Further, after the mask pattern 308 is removed, the polysilicon films 104b, 104a and gate-gate insulating film 105 are processed by etching with the mask patterns 307a, 307b, 307d used as a mask to form gate electrode patterns (cell word lines WL0 to WL31) of the memory cells MC0 to MC31, gate electrode patterns (selection gate lines SGS, SGD) of the selection gate transistors SGD-Tr, SGS-Tr, and dummy selection gate lines D-SGS, D-SGD (FIG. 16).

Figure 17:
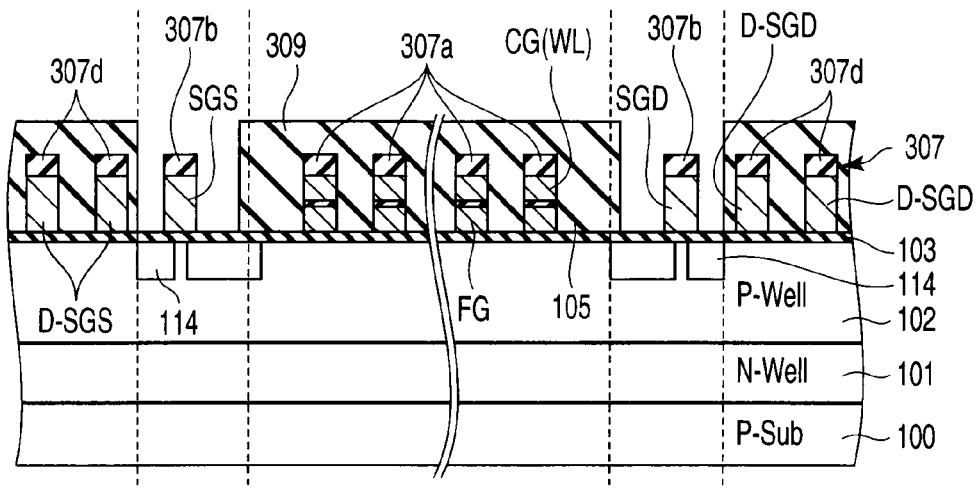
FIG. 17 is a cross-sectional view for illustrating a formation process of the memory cell array shown in FIGS. 14A and 14B.

After this, a desired mask pattern 309 is formed to cover at least the region for formation of the cell word lines WL0 to WL31, the region for formation of the source line contact 111 and the region for formation of the bit line contact 112. Then, boron (B) as a p-type impurity is doped with energy of approximately 10 keV, 3E12 ($3\times10^{12}$), for example, to form P-layers 114 that enlarges the threshold values of the selection gate transistors SGD-Tr, SGS-Tr on the surface of the P-Sub 100 with the mask pattern 309 used as a mask (FIG. 17).

Figure 18:
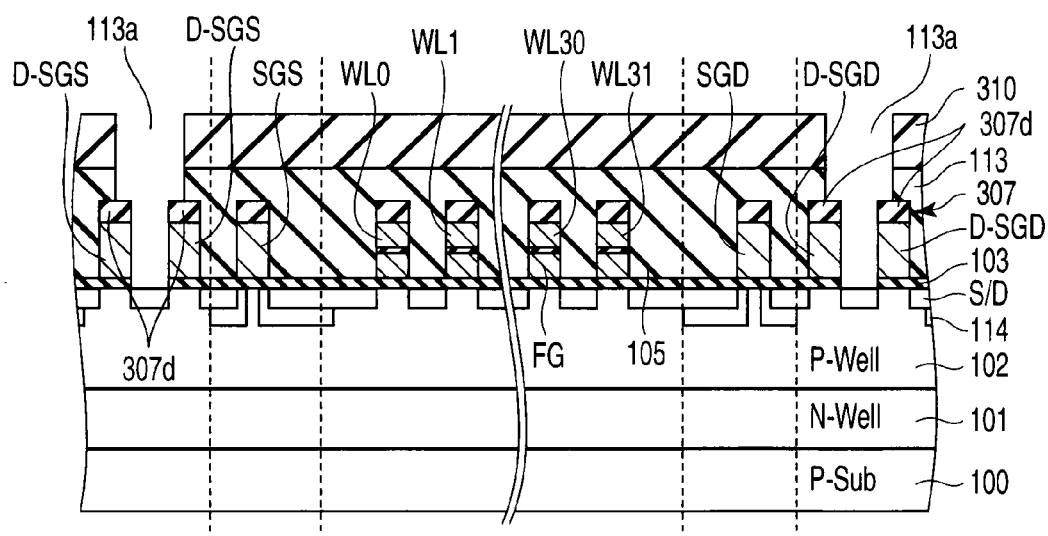
FIG. 18 is a cross-sectional view for illustrating a formation process of the memory cell array shown in FIGS. 14A and 14B.

Next, after the mask pattern 309 is removed, n-type diffusion regions S/D used as sources or drains are formed and an electrode-electrode insulating film 113 is formed. Then, an electrode-electrode insulating film 310 having a hole pattern formed thereon to form the source line contact 111 and bit line contact 112 is formed on the electrode-electrode insulating film 113. After this, the electrode-electrode insulating film 113 is etched to form contact holes 113a with the electrode-electrode insulating film 310 used as mask (FIG. 18). In this case, the dummy selection gate lines D-SGD, D-SGS and mask patterns 307d in the region for formation of the bit line contact 112 and the region for formation of the source line contact 111 function as a contact hole formation stopper film. Thus, the contact holes 113a are formed as a fine pattern in a self-alignment fashion by use of the dummy selection gate lines D-SGD, D-SGS and mask patterns 307d. That is, the contact holes 113a can be formed without fail by over-etching. Therefore, occurrence of contact defects due to insufficient opening can be completely prevented and the manufacturing yield of the memory cell array 11-3 can be enhanced.

Next, Wsi films are buried in the contact holes 113a to form the source line contact 111 between the dummy selection gate lines D-SGS and D-SGS and the bit line contact 112 between the dummy selection gate lines D-SGD and D-SGD.

After removing the electrode-electrode insulating film 310, the memory cell array 11-3 with the structure shown in FIGS. 14A and 14B can be attained by performing a known process.

According to the configuration of the present embodiment, the cell word lines WL0 to WL31 and selection gate lines SGS, SGD can be processed with extremely stable and highly controllable dimensions. Further, the distance $C=n*A+(n-1)B$, where n is an integer greater than or equal to 2, can be attained between the selection gate lines SGS, SGD and the cell word lines WL0, WL31 adjacent thereto. Therefore, a defect of injecting hot-electrons into the floating gate electrodes FG of corresponding memory cells MC0, MC31 by GIDL currents caused by the potentials transferred to the selection gate lines at the data write operation time can be avoided and data can be prevented from being destroyed.

In addition, since the exposure focus margin used for stable resist-processing is acquired, the bit line contact can be stably formed, the manufacturing yield of NAND flash memories can be enhanced and the reliability can be enhanced.

In the case of the selection gate lines formed at the same interconnection pitches as the cell word lines (third and fourth embodiments), adjacent ones of a plurality of polysilicon interconnection layers are connected together and can be used as one selection gate line.

Further, in each of the above embodiments, a case wherein this invention is applied to the NAND flash memory as an example is explained but, of course, the configuration of the NAND flash memory, for example, the number of cell word lines, is not limited to the configuration of each embodiment.

Further, the gate-gate insulating film is not limited to the ONO film and a ferroelectric film formed of alumina ($Al_2O_3$) can be used.

The charge storage layer is not necessarily formed of the floating gate using a polysilicon film and, for example, a silicon nitride film used in a MONOS nonvolatile memory device may be used.

Further, this invention is not limited to the NAND flash memory and can similarly be applied to various types of semiconductor memory devices in which a plurality of cell word lines are arranged at extremely narrow pitches, for example.

In addition, the process is not limited to a case wherein the dummy mask pattern that is independently provided is removed, but a desired distance $C=n*A+(n-1)B$, where n is an integer greater than or equal to 2, can be provided between the selection gate line and the cell word line adjacent thereto by removing a plurality of adjacent dummy mask patterns.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array including at least one memory unit having a preset number of memory cell transistors and a selection gate transistor on a source side;
   a plurality of word lines respectively connected to control gates of the preset number of memory cell transistors; and
   a selection gate line on a source side connected to a gate electrode of the selection gate transistor on the source side;
   wherein a distance C between the selection gate line at least on the source side and one of the word lines which lies adjacent to the selection gate line on the source side is set to $n*A+(n-1)B$, where n is an integer greater than or equal to 2, A indicates pitch between adjacent ones of the plurality of word lines, and B indicates width of each of the plurality of word lines.

2. The semiconductor memory device according to claim 1, wherein width of the selection gate line on the source side is set to B and a source line contact is disposed in a position separated from the selection gate line on the source side by A.

3. The semiconductor memory device according to claim 1, wherein width of the selection gate line on the source side is set to B, a dummy gate line is disposed in a position separated from the selection gate line on the source side by A and a source line contact is formed in self-alignment with the dummy gate line.

4. The semiconductor memory device according to claim 1, wherein the memory unit further includes a selection gate transistor on a drain side, and a distance C between a selection gate line on a drain side which is connected to a gate electrode of the selection gate transistor on the drain side and one of the word lines which lies adjacent to the selection gate line on the drain side is set to n*A+(n−1)B, where n is an integer greater than or equal to 2, A indicates pitch between adjacent ones of the plurality of word lines, and B indicates width of each of the plurality of word lines.

5. The semiconductor memory device according to claim 4, wherein width of the selection gate line on the drain side is set to B and a bit line contact is disposed in a position separated from the selection gate line on the drain side by A.

6. The semiconductor memory device according to claim 4, wherein width of the selection gate line on the drain side is set to B, a dummy gate line is disposed in a position separated from the selection gate line on the drain side by A and a bit line contact is formed in self-alignment with the dummy gate line.

7. A semiconductor memory device comprising:
   a memory cell array including a plurality of memory units each having a preset number of memory cell transistors which each have a stacked gate structure including a control gate and a charge storage layer and are disposed between a selection gate transistor on a drain side and a selection gate transistor on a source side;
   a plurality of word lines respectively connected to the control gates of the preset number of memory cell transistors of the plurality of memory units;
   a selection gate line on a drain side connected to gate electrodes of the selection gate transistors on the drain sides of the plurality of memory units; and
   a selection gate line on a source side connected to gate electrodes of the selection gate transistors on the source sides of the plurality of memory units;
   wherein a distance C between the selection gate line at least on the source side and one of the word lines which lies adjacent to the selection gate line on the source side is set to n*A+(n−1)B, where n is an integer greater than or equal to 2, A indicates a pitch between adjacent ones of the plurality of word lines, and B indicates width of each of the plurality of word lines.

8. The semiconductor memory device according to claim 7, wherein a distance C between the selection gate line on the drain side and one of the word lines which lies adjacent to the selection gate line on the drain side is set to n*A+(n−1)B, where n is an integer greater than or equal to 2.

9. The semiconductor memory device according to claim 7, wherein widths of the selection gate lines on the source and drain sides are set to B, a source line contact is disposed in a position separated from the selection gate line on the source side by A and a bit line contact is disposed in a position separated from the selection gate line on the drain side by A.

10. The semiconductor memory device according to claim 7, wherein widths of the selection gate lines on the source and drain sides are set to B, a dummy gate line is disposed in a position separated from the selection gate line on the source side by A, a source line contact is formed in self-alignment with the dummy gate line, a dummy gate line is disposed in a position separated from the selection gate line on the drain side by A, and a bit line contact is formed in self-alignment with the dummy gate line.

* * * * *